United States Patent
Gregorius et al.

(10) Patent No.: US 7,457,391 B2
(45) Date of Patent: *Nov. 25, 2008

(54) CLOCK AND DATA RECOVERY UNIT

(75) Inventors: Peter Gregorius, Munich (DE); Petyo Pentchev, Munich (DE)

(73) Assignee: Infineon Technologies AG, Munich (DE)

( * ) Notice: Subject to any disclaimer, the term of this patent is extended or adjusted under 35 U.S.C. 154(b) by 862 days.

This patent is subject to a terminal disclaimer.

(21) Appl. No.: 10/809,122

(22) Filed: Mar. 25, 2004

(65) Prior Publication Data

US 2004/0202266 A1    Oct. 14, 2004

Related U.S. Application Data

(60) Provisional application No. 60/457,690, filed on Mar. 26, 2003.

(51) Int. Cl.
*H03D 3/24* (2006.01)

(52) U.S. Cl. .................. 375/373; 375/354; 375/371; 375/375; 375/376; 327/1; 709/248

(58) Field of Classification Search ......... 375/354–356, 375/370, 371, 136, 147, 322, 324–327, 344–346, 375/348, 350, 358, 360, 373–375, 376
See application file for complete search history.

(56) References Cited

U.S. PATENT DOCUMENTS

| 6,646,822 B1 * | 11/2003 | Tuttle et al. .................... 360/46 |
| 7,149,269 B2 * | 12/2006 | Cranford et al. ............ 375/373 |
| 7,197,102 B2 * | 3/2007 | Rhee et al. .................... 375/376 |
| 7,292,662 B2 * | 11/2007 | Gregorius .................... 375/350 |
| 2002/0080898 A1 | 6/2002 | Agazzi et al. |
| 2006/0181797 A1 * | 8/2006 | Sugawara et al. ............. 360/51 |

FOREIGN PATENT DOCUMENTS

| DE | 19922804 | 11/1999 |
| WO | WO97/28624 | 8/1997 |

* cited by examiner

*Primary Examiner*—Shuwang Liu
*Assistant Examiner*—Hirdepal Singh
(74) *Attorney, Agent, or Firm*—Jenkins, Wilson, Taylor & Hunt, P.A.

(57) ABSTRACT

A clock and data recovery unit for recovering a received serial data bit stream having: phase adjustment means for adjustment of a sampling time in the center of a unit interval of the received data bit stream, wherein the phase adjustment means comprises means for generating equidistant reference phase signals, a phase interpolation unit, an oversampling unit, a serial-to-parallel-conversion unit, a binary phase detection unit, and a loop filter; and data recognition means for recovery of the received data stream which includes a number of parallel data recognition FIR-Filters, wherein each data recognition FIR-Filter comprises a weighting unit, a summing unit, and a comparator unit.

31 Claims, 25 Drawing Sheets

Fig. 3a                    Fig. 3b

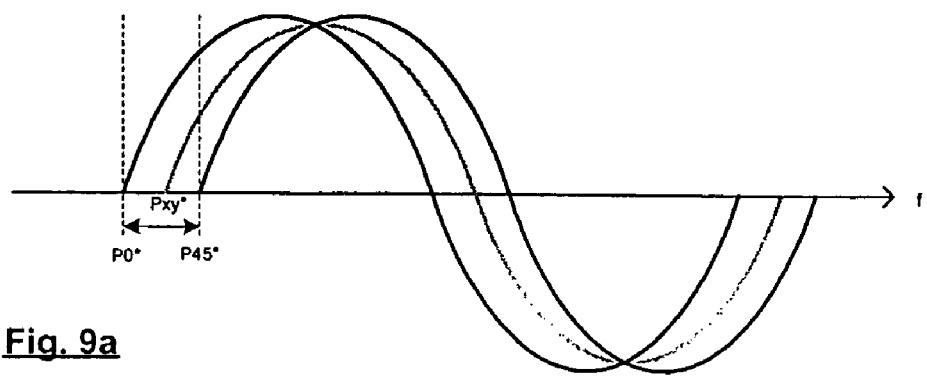
Fig. 9a
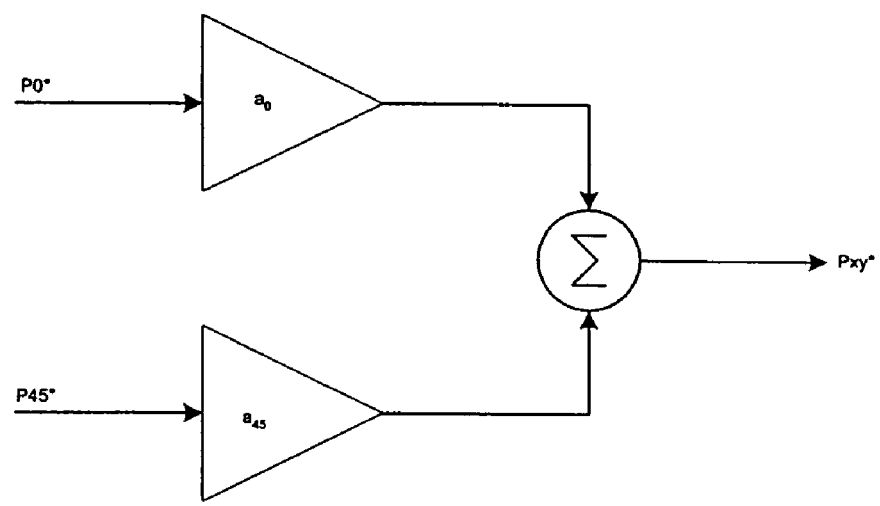
Fig. 9b
Fig. 9

Transition Loss Detection Unit (TLDU)

CLOCK AND DATA RECOVERY UNIT

RELATED APPLICATIONS

This application claims the benefit of U.S. Provisional Patent Application Ser. No. 60/457,690, filed Mar. 26, 2003, the disclosure of which is incorporated herein by reference in its entirety.

BACKGROUND OF THE INVENTION

A clock and data recovery unit

1. Technical Field

The invention refers to a clock and data recovery unit and a method for clock and data recovery which are provided for recovery of data pulses which have been subjected to severe noise on a transmission line/channel.

2. Background Art

The band limitation of the transmission channel results in the data signal at the receiver being subjected to distortion caused by intersymbol interference (ISI). The received signal itself contains both deterministic and stochastic edge noise.

The clock and data recovery unit according to the present invention provides for a reliable recovery of the data in a severely noisy environment and can be used in a multichannel application (Multiple Lane Application). The achieved BER is very low (Error rate BER<10^-15) even when the received data signal has only a small eye opening.

For high-speed data transmission, the requirements for the transceiver modules to have high speeds, low bit error rates (Bit Error Rate BER) and a long range are becoming more stringent. Depending on the channel and transmission medium, it is necessary to transmit data in the Gigahertz range, for example at 2.488 Gbit/s to 10 Gbit/s, with as few bit errors as possible.

The circuits for data recovery within the transceiver modules are referred to as clock and data recovery units (CDR). There are two fundamental concepts for data recovery according to the state of the art, i.e. phase alignment and phase picking.

FIG. 1 shows a clock and data recovery unit according to the state of the art as employed in a digital receiver.

Caused by clock jitter, band limitation of the data channels, intersymbol interferences (ISI) as well as reflections and crosstalk between the channels the effective usable signal eye opening is only approximately 35% or even smaller than of the respective data bit cell, so that in a 3,125 Gbit/s real bit data stream (NRZ=non return to zero)-modulated data has only a signal eye opening for each unit interval (UI) having a length of 112 ps while the rest of the bit cell is disturbed by clock jitter, intersymbol interferences (ISI) and reflections.

In the phase adjustment (phase alignment) method according to the state of the art a phase locked loop (PLL) is used to set the sampling time to the signal eye center of the received signal (bit cell). An edge-control D-flipflop which is generally used for recovering and synchronization samples the data applied at the D-input by means of the rising edge at the clock input.

FIG. 2 shows a PLL-based clock recovery system according to the state of the art.

In the phase picking method according to the state of the art in simple terms, the input signal is oversampled by connecting two or more D-flipflops in parallel, which are clocked with stepped clock phases. For data recovery, a control circuit then chooses the output of that D-flip-flop whose clock phase represents the optimum sampling time in the eye center.

Both conventional methods can be implemented in widely differing ways. Different kinds of both multiphase circuits or phase locked loops PLL can be used for implementation of the phase alignment method and the phase picking method.

Both conventional methods according to the state of the art require a phase detector PD, which assesses the phase angle $\phi$ of the input data signal with respect to the clock phase $\phi_{CLK}$ within the clock and data recovery unit. A digital phase detector PD can be regarded as an edge-control switching mechanism to which the received signal on the one hand and a clock phase on the other hand are supplied, and which detects the phase angle $\phi$ by means of international stage transitions. One fundamental disadvantage of such digital phase detectors PD is the fact that the received signal is normally distorted and interfered with by various unavoidable effects in the transmission channel, such as reflections, attenuation, channel crosstalk and intersymbol interference (ISI).

In conventional phase adjustment methods according to the state of the art a digital phase detector PD is provided in which the received data signal acts directly on edge-sensitive inputs, so that the above mentioned signal disturbances generally lead to incorrect assessments of the phase angle $\phi$. Provided that they do not occur excessively frequently, these incorrect assessments can be sufficiently suppressed by use of a very inert control system so that the signal disturbances do not immediately lead to unlocking of the phase locked loop PLL. However, an incorrect assessment of the phase angle $\phi$ leads to a reduction in the jitter budget even when using an inert control system, so that the received data signal needs to have a larger signal eye opening for the same bit error rate BER than would be the case with a phase detector PD that is less sensitive to the above mentioned signal disturbances. A further disadvantage of a inert control system is that the phase locked loop PLL takes longer to lock in.

With the conventional phase alignment methods, the data detection (recovery) is carried out at the data rate DR. The control loop for phase adjustment does not have to achieve the BER<10^-15, but the regenerative flipflop must have appropriate stability. Metastability of the flipflop leads to incorrect decisions in data recovery.

In order to avoid these disadvantages of phase adjustment methods in phase picking CDRs according to the state of the art the phase information is not obtained directly from the received data input signal, but the received data signal is oversampled and the phase angle $\phi$ is derived from the oversampled signal.

FIG. 3a, 3b show a phase picking data recovery system according to the state of the art.

In a phase picking data recovery system as shown in FIG. 3a multiple clock phases sample each data bit from the received serial data stream at multiple positions. The phase picking data recovery system detects data transitions and picks the data sample which is furthest away from the detected data transition. By delaying the data samples while the decision is made the phase picking data recovery system as shown in FIG. 3a employs a feed forward loop. Because stability constrains are absent the phase picking method achieves a very high bandwidth and track phase movements on a cycle-cycle-basis. However, the tracking can occur only at quantisised steps depending on the degree of oversampling. The phase picking decision causes some latency.

A principle disadvantage of conventional phase alignment methods and phase picking methods according to the state of the art is that only a small part of the received data signal is effectively used for the decision, wherein the usable signal part is defined by the position of the clock edge and the set and hold times of the decision circuit. To avoid infringement of the setup and hold times of the decision circuit which causes a metastability and so to a undefined logic value the decision circuit is implemented such that its setup and hold times are as small as possible. Accordingly the signal part around the clock edge which is in fact evaluated is very short and accordingly the evaluated signal energy is very low. High frequent disturbances such as high frequent noise leads in particular at very small signal eyes to an increased bit error rate (BER). Undesired high frequent noise can be provided on the supply voltage of the clock and data recovery unit or can be applied together with the received data signal.

To avoid the sensitivity of the clock and data recovery unit because of the small signal power of the sampled signal it is known to use current integrating receivers. In this current integrating receivers the differential data input signal is integrated during a time period corresponding to the unit interval UI of a bit cell. At the end of the bit cell it is evaluated whether the current integral is positive or negative to recover the data bit. However, in a communication system wherein the usable signal eye opening is only in the range of 35% or even smaller of the received bit cell a current integrating receiver can not be employed, because the distorted and disturbed signal portions would be outside the usable signal eye opening.

FIG. 4 shows a conventional binary phase detection (BPD) circuit as employed in a clock and data recovery unit according to the state of the art, wherein a phase picking method is used. The received digital data signal is oversampled by an oversampling unit which generates data samples Si. EXOR gates compare neighboring data samples Si to decide whether a data transition has occurred. The EXOR gates are connected on the output side to summation means to calculate the phase difference Δφ between the incoming serial data bit stream and a reference time. The output signal of the binary phase detector BPD is supplied to a loop filter. The loop filter is a low path filter (LPF) having the following open loop transfer function:

$$\frac{\phi_{out}}{\phi_{in}} = \frac{A_0(DD)}{1 + \frac{s}{w_P} + A_0(DD)} \quad (1)$$

wherein DD is the data density of received serial data bit stream.

FIG. 5 shows the loop gain of the data and recovery unit according to the state of the art as shown in FIG. 4 for a conventional low path loop filter (LPF).

As can be seen from FIG. 5 the loop gain is decreased when the data density DD of the received serial date bit stream is lowered.

FIG. 6a shows the phase detector gain PDG of the conventional clock and data recovery unit having a binary phase detector BPD as shown in FIG. 4. As can be seen from FIG. 6a the lower the data density DD of the received serial data bit stream is, i.e. the lower the number of detected data transitions is the smaller is the phase detector gain PDG. The lower the data density DD of the received serial bit stream is, the lower is the number of data transitions which include the information for adjusting the phase of the clock signal to be recovered.

SUMMARY

Accordingly it is the object of the present invention to provide a clock and data recovery unit and a method for recovering a received serial data stream which are insensitive to variations of the data density DD of the received serial data bit stream.

This object is achieved by a clock and data recovery unit having the features of main claim 1.

FIG. 6b shows the phase detector gain of the clock and data recovery unit according to a preferred embodiment of the present invention.

The invention provides a clock and data recovery unit for recovering a received serial data bit stream having (a) phase adjustment means for adjustment of a sampling time in the center of a unit interval (UI) of the received data bit stream, wherein the phase adjustment means comprises:

(a1) a means for generating equidistant reference phase signals;

(a2) a phase interpolation unit (PIU) which rotates the generated reference phase signals with a predetermined granularity in response to a rotation control signal;

(a3) an oversampling unit (OSU) for oversampling the received data stream with the rotated reference phase signals according to a predetermined oversampling rate (OSR);

(a4) a serial-to-parallel-conversion unit which converts the oversampled data stream into a deserialized data stream with a predetermined decimation factor (DF);

(a5) a binary phase detection unit (BPD) for detecting an average phase difference (APD) between the received serial data bit stream and the rotated reference phase signal by adjusting a phase detector gain (PDG) depending on the actual data density (DD) of the parallised data stream such that the variation of the average phase detection gain (PDG) is minimized; and (a6) a loop filter for filtering the detected average phase difference (APD) to generate the rotation control signal for the phase interpolation unit (PIU);

(b1) a weighting unit for weighting data samples of the parallised data stream around the sampling time adjusted by the phase adjustment means;

(b2) a summing unit for summing up the weighted data samples; and (b3) a comparator unit for comparing the summed up data samples with a threshold value to detect the logic value of a data bit within the received serial data bit stream.

An advantage of the clock and data recovery unit according to the present invention is that redundant data information which are used for phase synchronization is at the same time used for recovery of the serial data bit stream. Accordingly the data recovery unit is very robust in a noisy environment.

The clock and data recovery unit according to the present invention is very robust with respect to variations or jitter of the sampling phase.

A further advantage of the clock and data receiver unit according to the present invention is that the same circuitry is used for two different functions at the same time, i.e. for phase adjustment and for data recognition.

In a preferred embodiment the clock and data recovery unit according to the present invention comprises means for detecting the actual data density (number of transitions) of the deserialized data bit stream and means for adjusting the phase detector gain (PDG) depending on the detected actual data density (number of transitions).

In a preferred embodiment of the clock and data recovery unit according to the present invention the means for detecting the actual data density comprises a plurality of EXOR gates, wherein each EXOR gate compares two neighboring data samples generated by the oversampling unit to decide whether a data transition has occurred.

In a preferred embodiment of the clock and data recovery unit according to the present invention the means for detecting the actual data density further comprises summation means for accumulating the number of data transitions detected by the EXOR gates.

In a preferred embodiment of the clock and data recovery unit according to the present invention the means for adjusting the phase detector gain calculates the phase detector gain by multiplying the accumulated number of data transitions with a multiplication factor (MF).

In a preferred embodiment of the clock and data recovery unit according to the present invention the multiplication factor (MF) is increased when the detected number of data transition has decreased.

In a preferred embodiment of the clock and data recovery unit according to the present invention the number (N) of EXOR gates for detection of the actual data density is given by the product of the decimation factor (DF) of the serial-to-parallel-conversion unit and the oversampling rate (OSR) of the oversampling unit:

$$N=DF \times OSR$$

In a preferred embodiment of the clock and data recovery unit according to the present invention the decimation factor (DF) of the serial-to-parallel-conversion unit is eight (DF=8).

In a preferred embodiment of the clock and data recovery unit according to the present invention the oversampling rate (OSR) of the oversampling unit is four (OSR=4).

In a preferred embodiment of the clock and data recovery unit according to the present invention the data transmission rate (DR) of the serial data bit stream is more than one Gigabit per second.

$$DR \geq 1 Gbit/sec$$

In a preferred embodiment of the clock and data recovery unit according to the present invention the weighting unit of the data recognition means comprises signal amplifiers, wherein each signal amplifier amplifies a respective data sample with a programmable gain.

In a preferred embodiment of the clock and data recovery unit according to the present invention the data recognition FIR-Filters of the data recognition means are connected to a FIFO-register.

In a preferred embodiment of the clock and data recovery unit according to the present invention the number of data recognition FIR-Filters corresponds to the decimation factor (DF) of the serial-to-parallel-low-conversion unit.

In a preferred embodiment of the clock and data recovery unit according to the present invention the oversampling unit comprises a predetermined number of clock triggered sampling elements.

In a preferred embodiment the sampling elements are D-Flip-flops.

In an alternative embodiment the sampling elements are D-Latches.

In a preferred embodiment of the clock and data recovery unit according to the present invention each sampling element is clocked by a corresponding rotated reference phase signal generated by the phase interpolation unit.

In a preferred embodiment of the clock and data recovery unit according to the present invention the phase interpolation unit comprises a phase interpolator and a multiplexer for rotating the phase signals in response to the rotation control signal.

In a preferred embodiment of the clock and data recovery unit according to the present invention the delay locked loop (DLL) receives a reference clock signal from a reference clock generator.

In a preferred embodiment of the clock and data recovery unit according to the present invention the reference clock generator is formed by a phase locked loop (PLL).

In a preferred embodiment of the clock and data recovery unit according to the present invention the loop filter has a PID filter characteristic.

In a preferred embodiment the loop filter is programmable.

In a preferred embodiment of the clock and data recovery unit according to the present invention a lock detection unit is provided which detects whether the clock and data recovery unit is locked to the received serial data bit stream.

In a preferred embodiment of the clock and data recovery unit according to the present invention a transition loss detection unit is provided which detects when the serial data bit stream has stopped.

In a preferred embodiment of the clock and data recovery unit according to the present invention the phase adjustment means and the data recognition means are integrated in a digital control unit.

In a preferred embodiment of the clock and data recovery unit according to the present invention the digital control unit further includes the lock detection unit and the transition loss detection unit.

In a preferred embodiment of the clock and data recovery unit according to the present invention a multiplexer for rotating the reference phase signal in response to the rotation control signal is integrated in said digital control unit.

In a preferred embodiment of the clock and data recovery unit according to the present invention the equidistant reference phase signals which are generated by the delay locked loop (DLL) have a phase difference $\Delta\phi$ of 45° to define eight phase segments.

In a preferred embodiment of the clock and data recovery unit according to the present invention the phase interpolator interpolates phase signals in each phase segment on the basis of the equidistant reference phase signals.

The invention further provides a method for clock and data recovery of a received serial data stream comprising the following steps:

(a1) rotating generated reference phase signals in response to a rotation control signal;

(a2) oversampling the received data bit stream with the rotated reference phase signals;

(a3) converting the oversampled data bit stream into a deserialized data stream;

(a4) detecting an average phase difference between the received serial data bit stream and the rotated phase signals by adjusting a phase detector gain (PDG) depending on the data density (DD) of the parallised data stream to minimize the variation of the average phase detector gain;

(a5) filtering the detected phase difference to generate the rotation control signal;

(b1) weighting data samples of the parallised data stream around the adjusted sampling time;

(b2) summing up the weighted data samples;

(b3) comparing the summed up weighted data samples with a threshold value to detect the logic value of a data bit within the serial data bit stream.

In the following preferred embodiments of the clock and data recovery unit according to the present invention and the method for clock and data recovery are described with reference to the enclosed figures.

BRIEF DESCRIPTION OF THE DRAWINGS

FIG. 9a shows a timing diagram that illustrates the functionality of the phase interpolation unit according to the present invention.

FIG. 9b shows a block diagram of a part of a interpolation unit as employed in a clock and data recovery unit according to the present invention.

DETAILED DESCRIPTION

Figure 7:
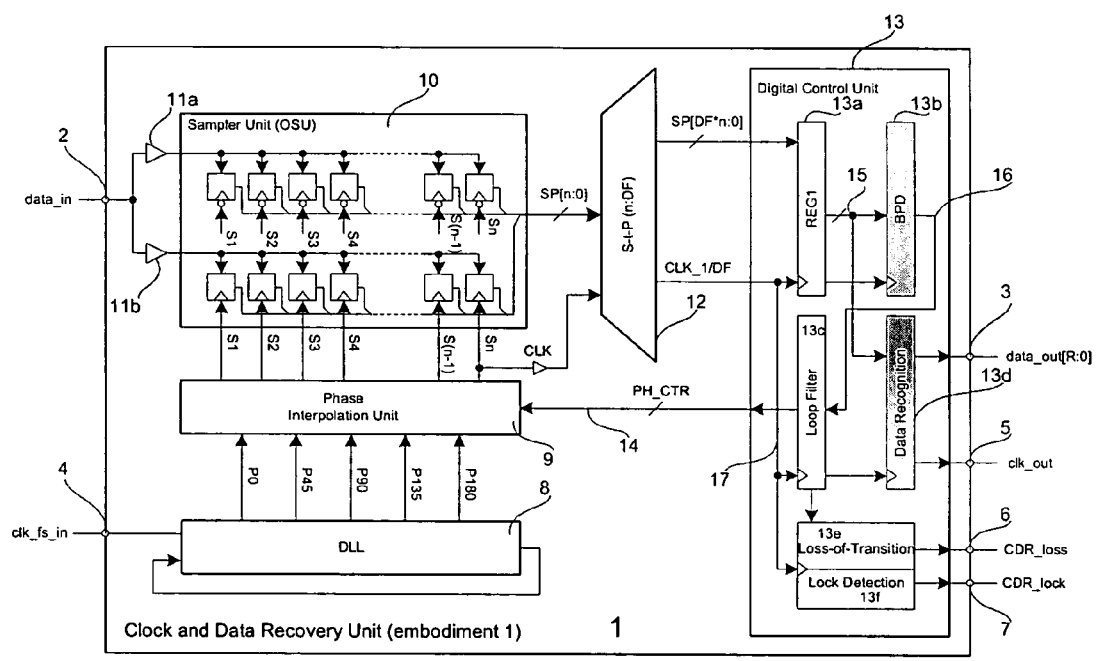
FIG. 7 shows a preferred embodiment of the clock and data recovery unit according to the present invention.

As can be seen from FIG. 7 the clock and data recovery unit 1 according to a first embodiment of the present invention comprises phase adjustment means to center the ideal sampling point in the middle of a unit interval UI of the received serial data stream. The clock and data recovery unit 1 further comprises data recognition means for recovery of the received data stream.

The clock and data recovery unit 1 comprises a data input 2 for receiving the serial data bit stream over a data transmission channel. The recovered data streams are output by the clock and data recovery unit 1 via a data output terminal 3.

The clock and data recovery unit 1 further comprises a reference clock input terminal 4 for receiving a reference clock signal from a clock signal generator or a system clock signal. The recovered clock signal of the received serial bit stream is output by the clock and data recovery unit 1 via a clock output terminal 5. Further an output terminal 7 is provided for indicating that the clock and data recovery unit 1 has locked to the serial data bit stream. If the received serial data bit stream is interrupted or stopped this is indicated by the output terminal 6 of the clock and data recovery unit 1.

The clock and data recovery unit 1 according to the present invention comprises a delay locked loop 8 which generates equidistant reference phase signals Pi on the basis of the received reference clock signal applied to input terminal 4.

Figure 8:
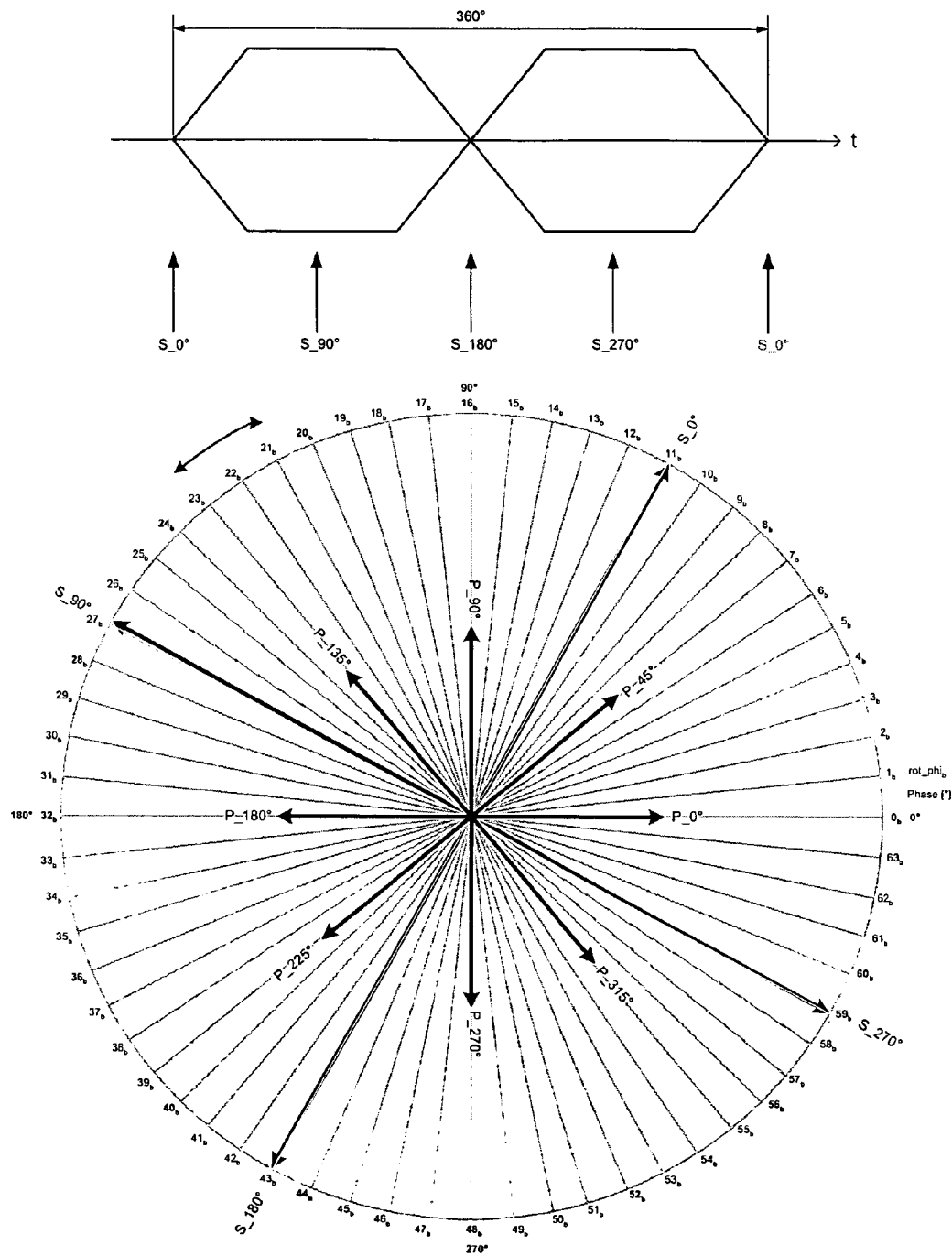
FIG. 8 shows the reference phase signals generated by a delay locked loop of the clock and data recovery unit according to the present invention.

FIG. 8 shows the reference phase signals $P_i$ generated by the delay locked loop 8 of the clock and data recovery unit 1. The reference phase signals Pi are equidistant reference phase signals, i.e. the phase difference $\Delta\phi$ between the reference phase signal is constant. In the shown example the phase difference $\Delta\phi$ is 45°.

Figure 1:
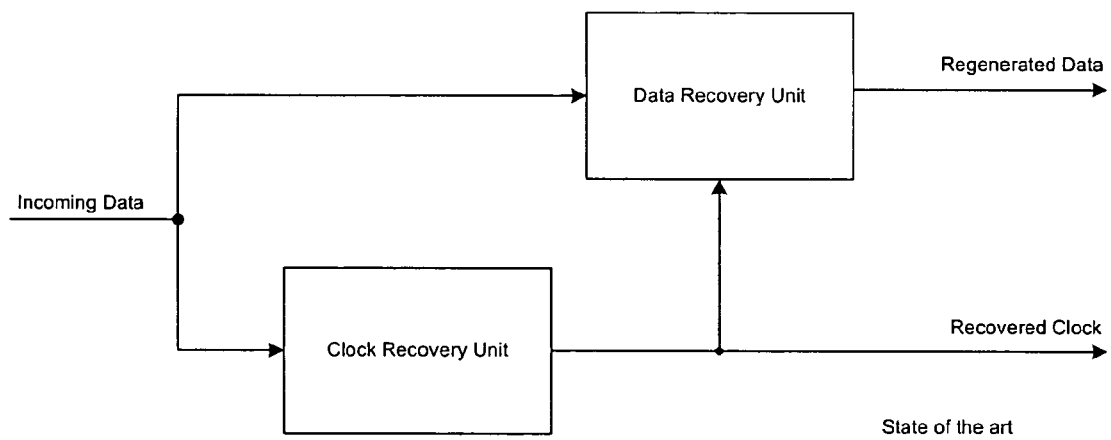
FIG. 1 shows a clock and data recovery unit according to the state of the art.
Figure 2:
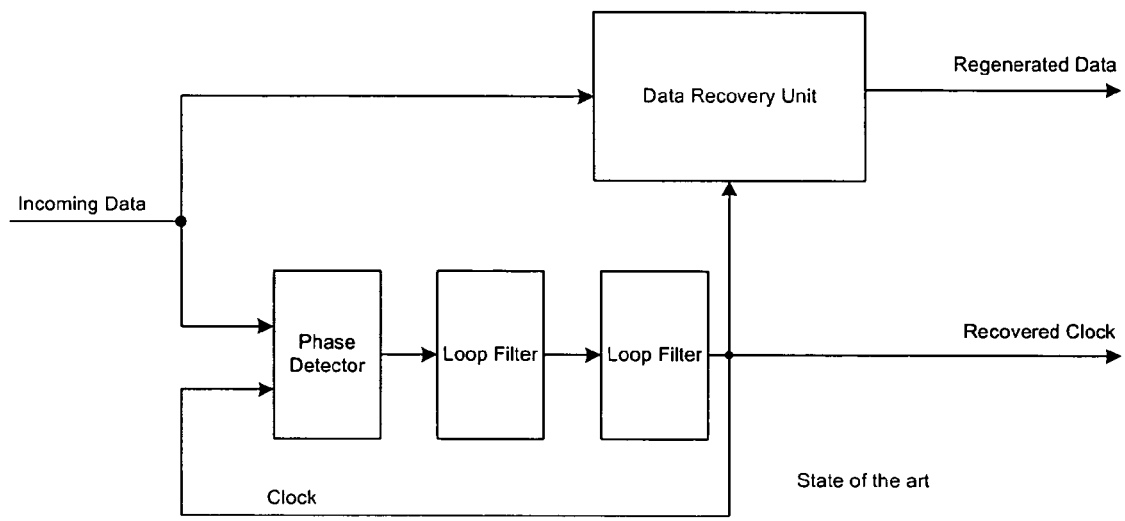
FIG. 2 shows a PLL based clock recovery system according to the state of the art.
Figure 3:
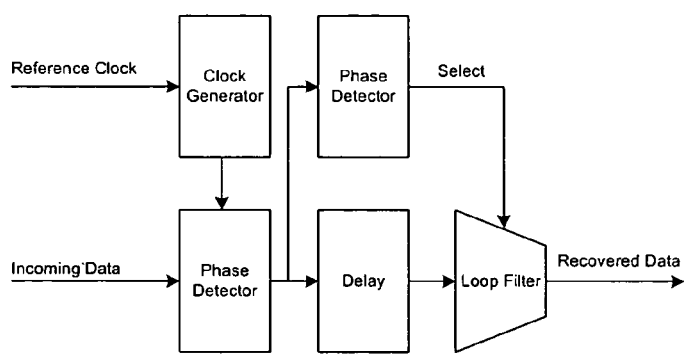
FIG. 3a, 3b show a phase picking data recovery system according to the state of the art.
Figure 3:
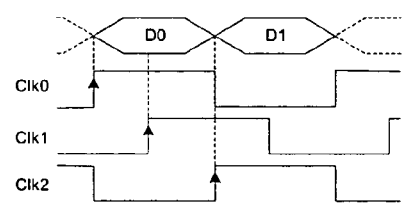
Figure 4:
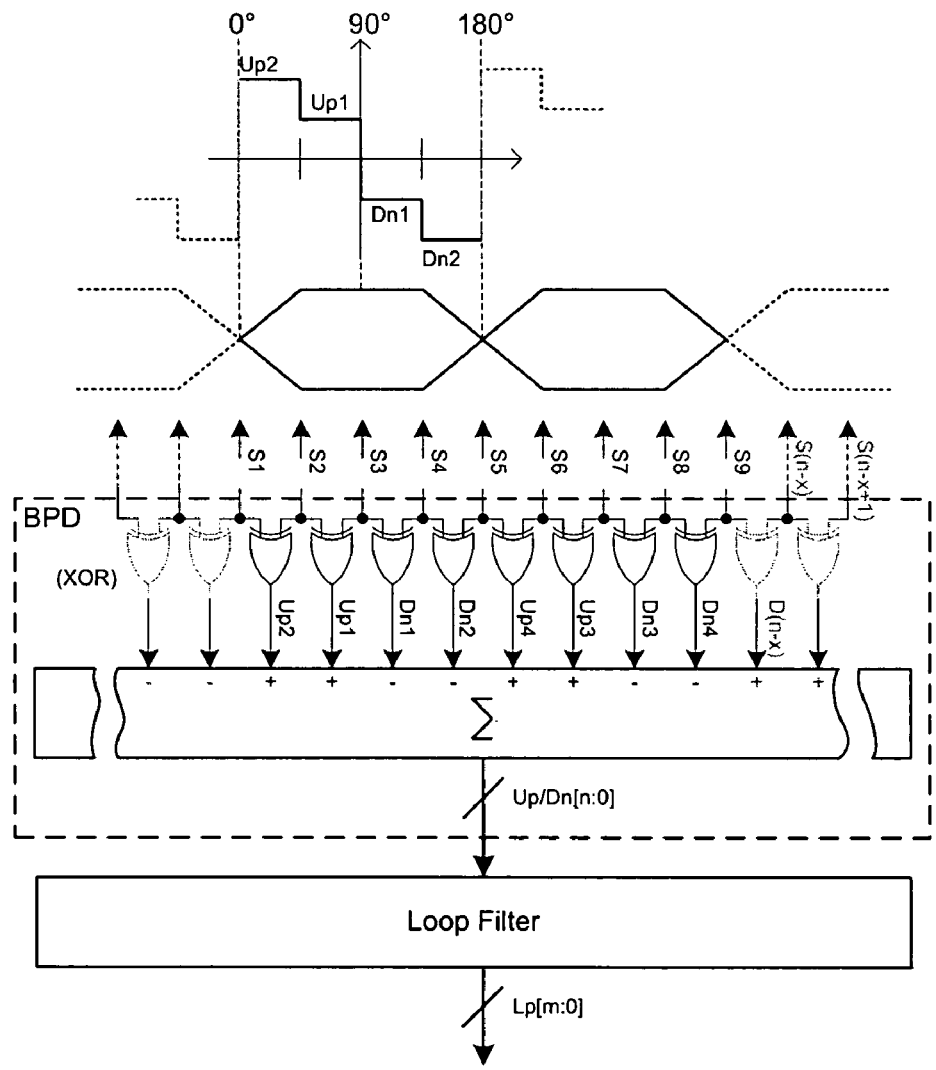
FIG. 4 shows a binary phase detection circuit according to the state of the art.
Figure 5:
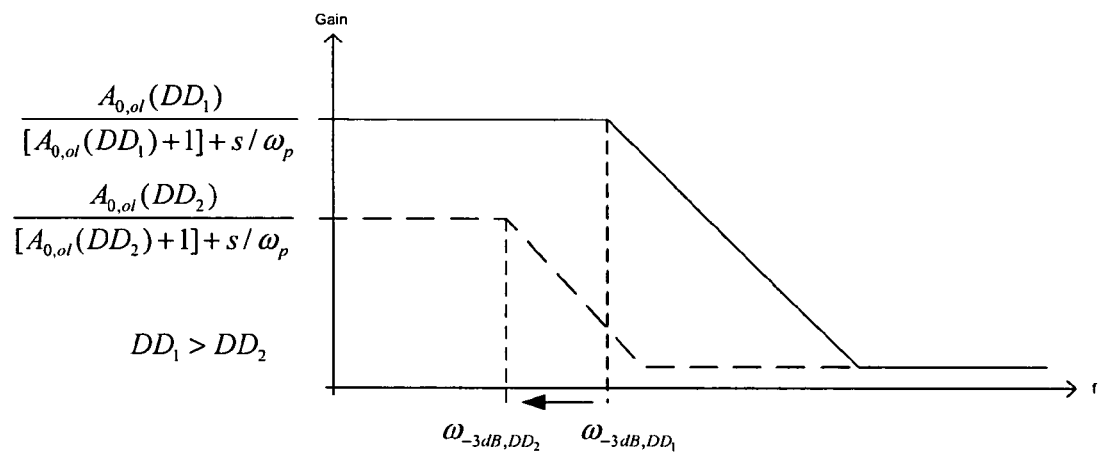
FIG. 5 shows the loop gain of the data recovery unit according to the state of the art.
Figure 6A:
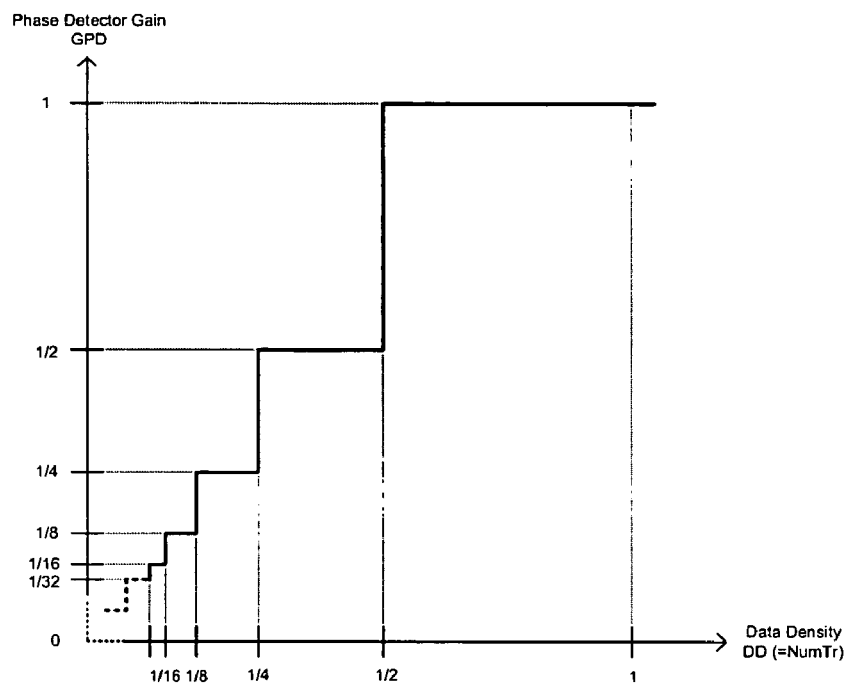
FIG. 6a shows a phase detector gain of a conventional clock and data recovery unit according to the state of the art.
Figure 6B:
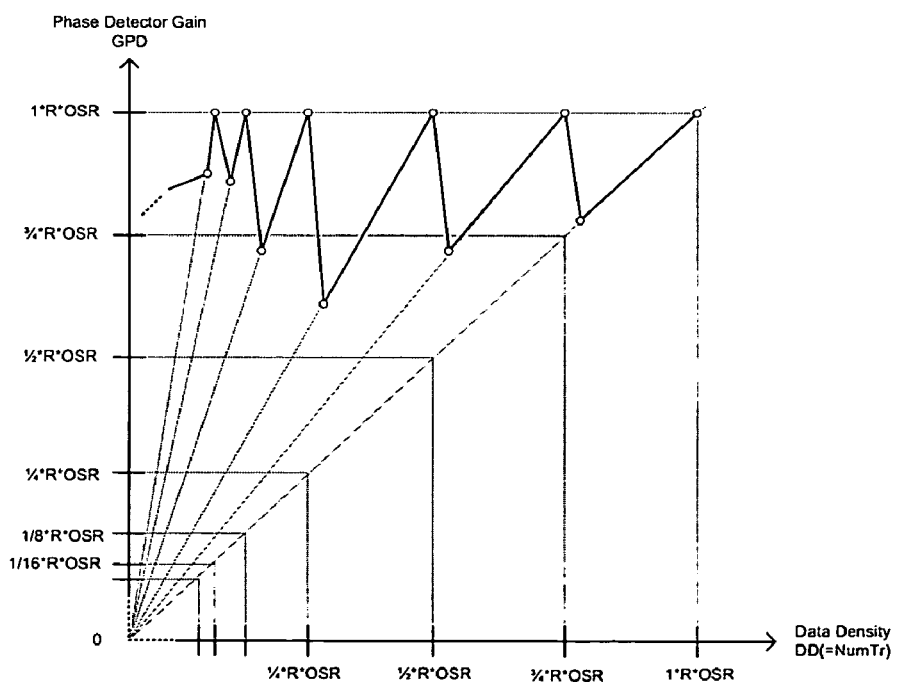
FIG. 6b shows a phase detector gain of the clock and data recovery unit according to the invention.

The clock and data recovery unit 1 as shown in FIG. 1 further comprises a phase interpolation unit 9 which continuously rotates the generated reference phase signals $P_i$ with a predetermined granularity in response to a digital control signal. The reference phase signals $P_i$ as shown in FIG. 8 define eight phase segments. The phase interpolation unit interpolates in response to the applied digital control signal phase signals on the basis of the received reference phase signals $P_i$.

FIG. 9a, 9b illustrate the functionality of the phase interpolation unit 9 as shown in FIG. 7. The phase signal $S_{xy}$ which has a phase between the first reference phase of e.g. 0° and a second reference phase of e.g. 45° is generated by adjusting the gain coefficient are $A_0$, $A_{45}$ of the respective signal amplifiers within the phase interpolation unit and by performing a summation of the weighted signals. If for instance $A_0 = A_{45}$ the generated phase signal is in this first segment between $P_0$, $P_{45}$ and has a phase of 22,5°. If $A_0$ is higher than $A_{45}$ the phase signal S has a phase which is smaller than 22,5° whereas when $A_0$ is smaller than $A_1$ the created phase signal S has a phase which is higher than 22,5°. The more reference phase signals $P_i$ are generated by the delay locked loop DLL the higher is the accuracy of the phase interpolation performed by the phase interpolation unit 9. The granularity of the phase interpolation is given by the bit width of the applied control signal. If the control signal has a bit width of e.g. six bits the phase signals generated by the interpolation unit comprise $2^6 = 64$ different phase signals S in each segment between two neighboring reference phase signals $P_i$.

The interpolated phase signals $S_i$ are supplied by the phase interpolation unit 9 to a oversampling unit 10 of the clock and data recovery unit 1. The oversampling unit 10 receives the supplied serial data bit stream via buffers 11a, 11b. The received data bit stream is oversampled by means of the rotated reference phase signals $S_i$ according to a predetermined oversampling rate (OSR).

The output of the oversampling unit 10 is connected to a serial-to-parallel-conversion unit 12 which converts the oversampled data stream into a parallised data stream with a predetermined decimation factor (DF). The width of the parallised data stream is defined by the product of the oversampling rate (OSR) and the decimation factor (DF).

The deserialized data stream is supplied to a digital control unit 13 within the clock and data recovery unit 1. The digital control unit 13 comprises a register 13a for storing the received parallised data stream from the serial-to-parallel-converter 12. The digital control 13 unit further comprises a binary phase detection unit 13b for detecting an average phase difference between the received serial data bit stream and the rotated reference phase signal $S_i$ by adjusting a phase detector gain PDG depending on the actual data density DD of the parallised data stream stored in register 13a such that the variation of the average phase detection gain is minimized.

The digital control unit 13 further includes a loop filter 13c for filtering the detected average phase difference to generate the rotation control signal for the phase interpolation unit 9. The loop filter 13c supplies the rotation control signal via a control line 14 to the phase interpolation unit 9. The digital control unit 13 of the clock and data recovery unit 1 as shown in FIG. 7 further includes data recognition means 13d for recovery of the received data stream. The output of the data recognition unit 13d is connected to the output data terminal 3 of the clock data recovery unit 1.

The digital control unit 13 of the clock and data recovery unit 1 further includes a loss of transition detection circuit 13e and a lock of detection circuit 13f.

The transition loss detection unit 13e detects when the serial data bit stream applied to input terminal 2 has stopped and indicates the interruption of the received serial data by indicating a CDR-loss signal via terminal 6.

The lock detection unit 13f detects whether the clock and data recovery unit 1 is locked to the received serial data bit stream and indicates such a lock by a CDR-lock signal via terminal 7.

Figure 10:
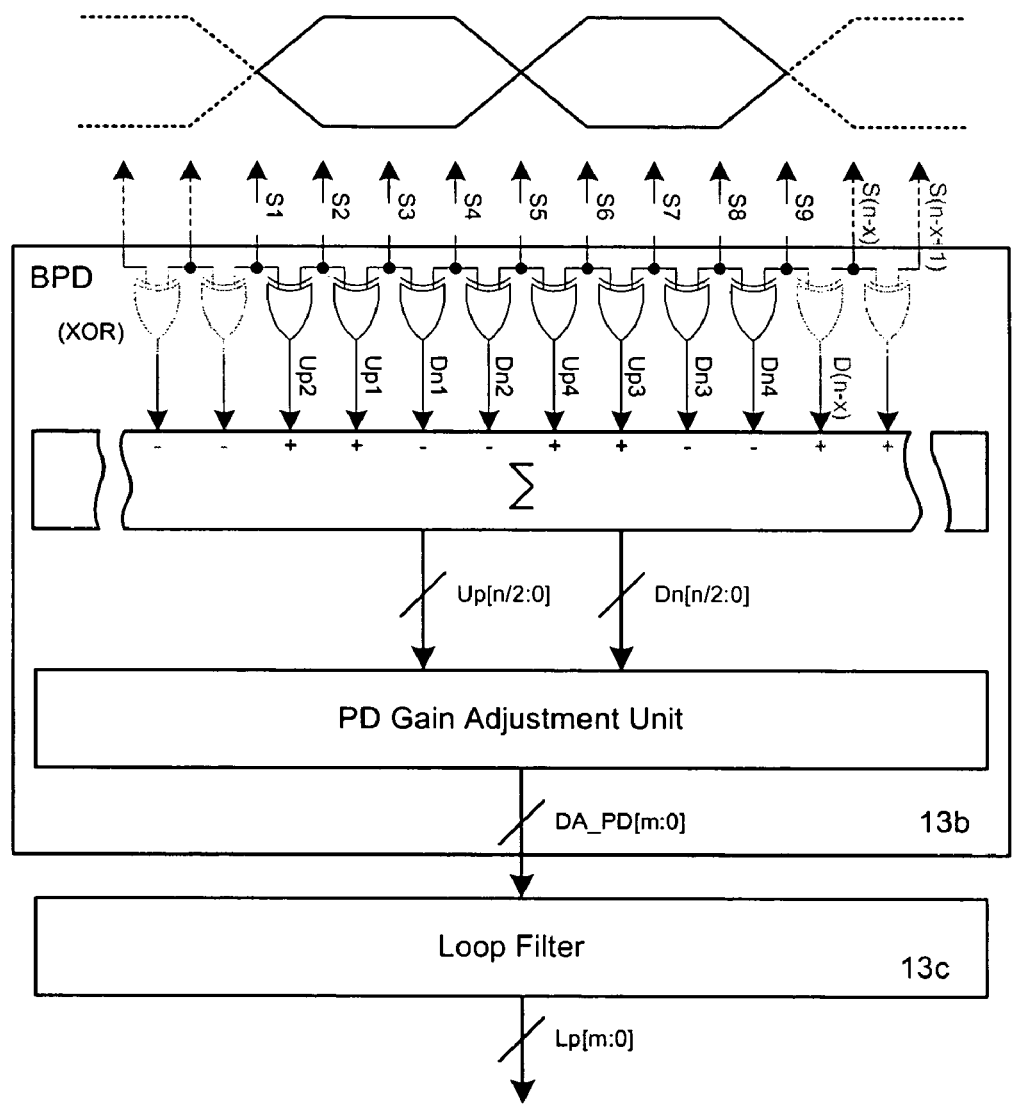
FIG. 10 shows a preferred embodiment of a binary phase detector as employed in a clock and data recovery unit according to the present invention.

FIG. 10 shows a preferred embodiment of the binary phase detector 13b according to the present invention. The binary phase detection unit 13b within the digital control unit 13 is provided for detecting an average phase difference (APD) between the received serial data bit stream and the rotated reference phase signal Si by adjusting a phase detector gain (PDG) depending on the actual data density (DD) of the parallised data stream such that the variation of the average phase detection gain (PDG) is minimized.

The binary phase detection unit 13b comprises means for detecting the actual data density DD of the parallised data bit stream and means for adjusting the phase detector gain (PDG) depending on the detected actual data density DD. The actual data density DD is detected by a plurality of EXOR gates wherein each EXOR gate compares two neighboring data samples to decide whether a data transition has occurred. Summation means are provided for accumulating the number of transitions detected by the EXOR gates. The output of the summation means is connected to the gain adjustment unit for adjusting the phase detector gain (PDG).

Figure 11:
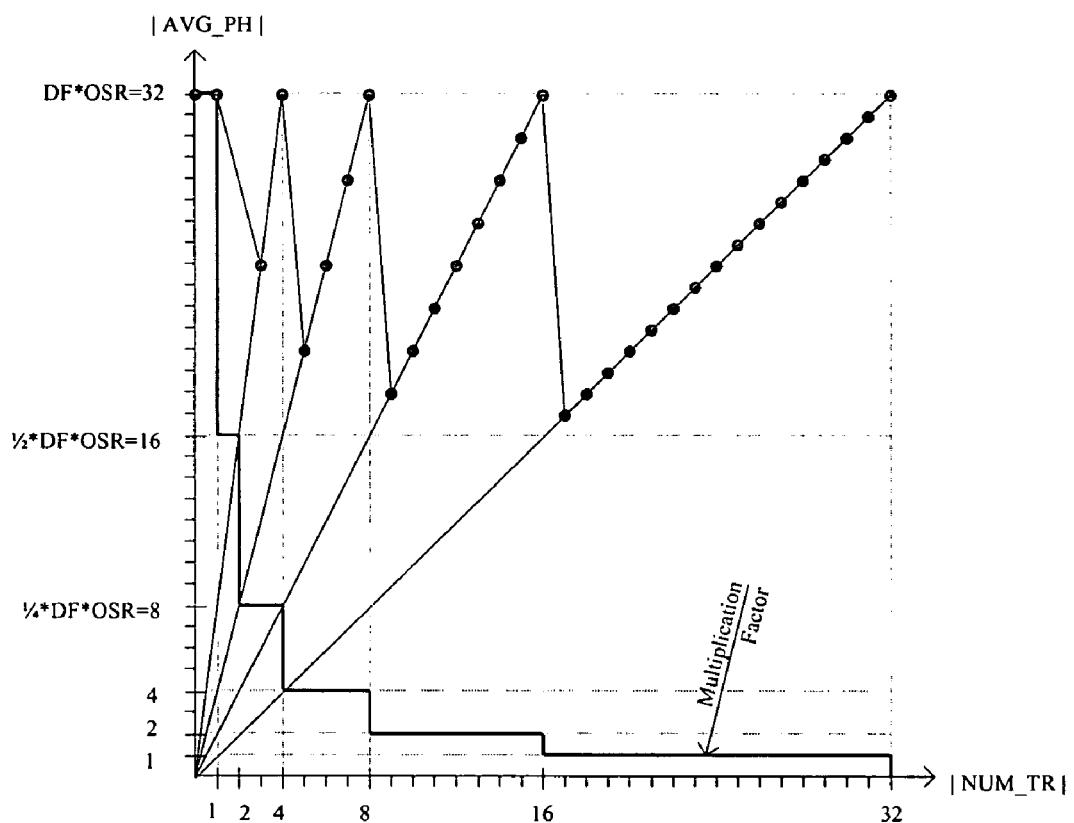
FIG. 11 shows a diagram to illustrate the functionality of a binary phase detection unit according to the present invention.

FIG. 11 shows a diagram to illustrate the functionality of the means for adjusting the phase detector gain (PDG) depending on the detected actual data density DD within the binary phase detection unit as shown in FIG. 10. The means for adjusting the phase detector gain PDG calculate the phase detector gain by multiplying the accumulated number of transition with a multiplication factor (MF). The multiplication factor (MF) is increased by the PD gain adjustment unit when the detected number of data transitions within the received serial data bit stream has decreased.

The number of EXOR gates used for detection of the actual data density (DD) is given by the product of the decimation factor (DF) of the serial-to-parallel-conversion unit 12 and the oversampling rate (OSR) of the oversampling unit 10:

$N = DF \times OSR$

In a preferred embodiment of the clock and data recovery unit 1 the decimation factor DF of the serial-to-parallel-conversion unit 12 is eight (DF=8) and the oversampling rate (OSR) of the oversampling unit is four (OSR=4).

Figure 12:
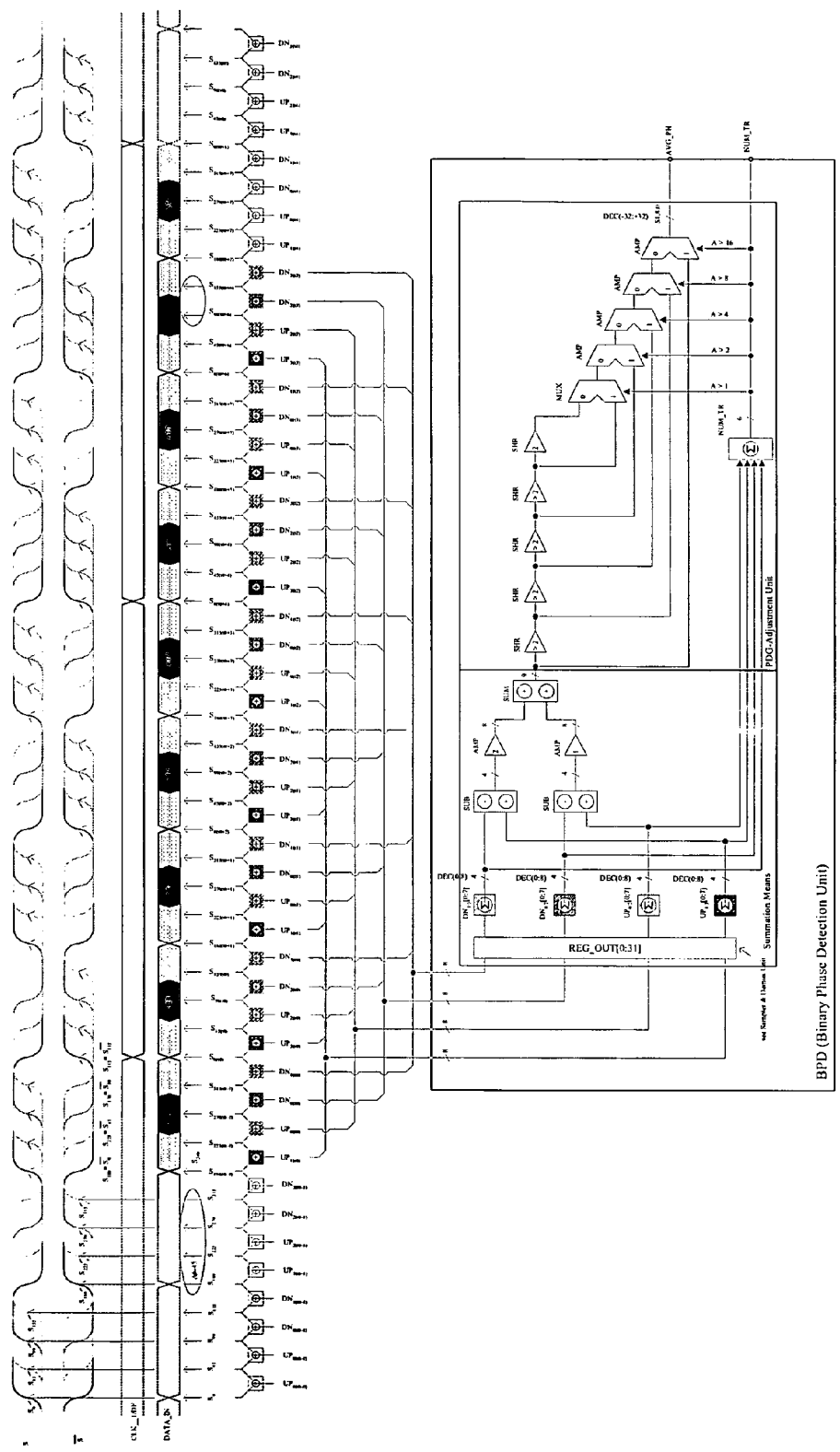
FIG. 12 shows a preferred embodiment of the binary phase detection unit according to the present invention.

Accordingly the number of EXOR gates within the binary phase detector 13b is 32 to detect up to 32 data transitions as shown in FIG. 12.

If the number of data transitions is higher than 16 the multiplication factor MF is set to 1.

If the number of transitions is between 8 and 16 the multiplication factor MF is set to 2.

If the number of data transitions is between 4 and 8 the multiplication factor MF is set to 4.

If the number of detected data transitions is between 2 and 4 the multiplication factor MF is set to 8.

If the number of detected transitions is 2 the multiplication factor is set to 16 and If the number of detected transitions is only 1 the multiplication factor MF is set to 32.

In an alternative embodiment the multiplication factor MF is normalized to the possible maximum number of transitions (NUM-TR$_{max}$=DF·OSR)

The calculated average phase signal (AVG-PH) is given by the product of the multiplication factor MF and the number of detected data transitions (NUM-TR).

The lower the data density DD of the received data bit stream is the higher is the set multiplication factor MF of the PD gain adjustment unit within in the binary phase detector 13b. Accordingly the binary phase detector 13b of the invention compensates for variations of the data density DD of the received serial bit stream so that the clock and data recovery unit 1 according to the present invention becomes insensitive to variations of the data density DD.

FIG. 12 shows a preferred embodiment of the binary phase detector 13b as shown in FIG. 10, 11 for detecting an average phase difference (AVG-PH). The plurality of EXOR gates are provided wherein each EXOR gate compares two neighboring data symbols as Si generated by the oversampling unit 10 to decide whether a data transition has occurred. In the embodiment shown in FIG. 13 the data transitions within eight signal eyes (eye 1-0 to 8-0) are detected by the EXOR gates. The detected data transitions are stored in a data buffer or register which comprises 32 data bit. The number of transitions is accumulated to a control signal NUM-TR controlling multiplexers MUX within the binary phase detection unit. The calculated phase difference calculated by summation means is supplied to the PDG-adjustment unit which comprises shifting elements SHR and multiplexers MUX. The multiplexer MUX are controlled by means of the accumulated number of data transitions.

In a preferred embodiment the data transitions of the signal eye 1-1 of the preceding data word is also stored.

Figure 13:
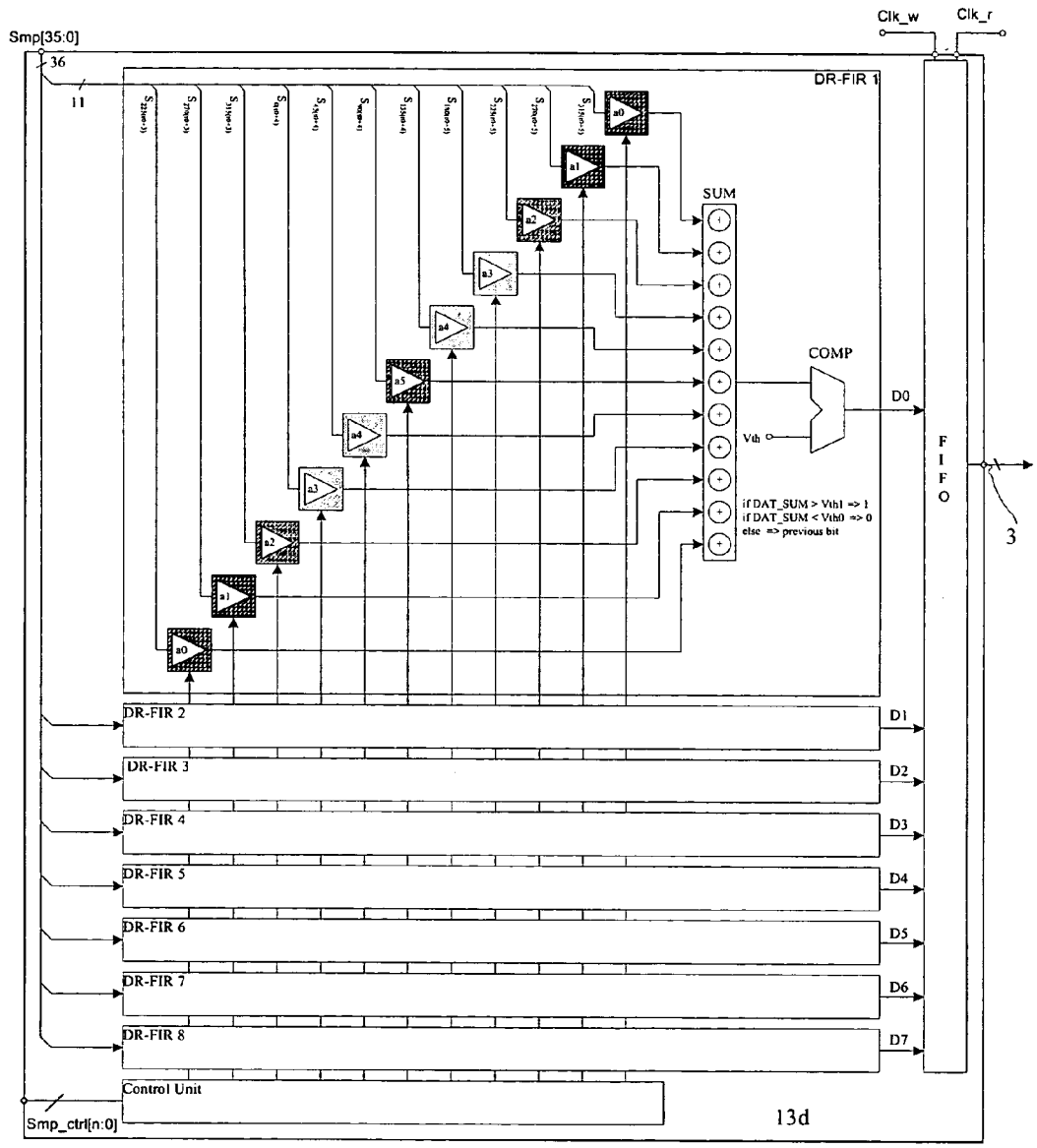
FIG. 13 shows a preferred embodiment of the data recognition unit according to the present invention.

FIG. 13 shows a preferred embodiment of the data recognition unit 13d within the digital control unit 13.

The data recognition means 13d is provided for recovery of the received data stream and comprises a number of parallel data recognition FIR-Filters DR–FIR. Each data recognition filter (DR–FIR$_i$) comprises a weighting unit for weighting the data samples of the parallised data stream around the sampling time adjusted by the phase adjustment means. Further each FIR-Filter comprises a summing unit (SUM) for summing up the weighted data samples and a comparator unit (COMP) for comparing the summed up data samples with a threshold value to detect the logic value of a data bit $D_i$ within the received serial data bit stream. If the summed up data sample is higher than a programmable first threshold value $V_{th}$ a received data bit is decided to be logic high. If the summed up data samples are lower than a programmable second threshold value ($V_{thO}$) than the received data bit decided to be logical low. The data recognition FIR-Filters DR–FIR$_i$ are connected to a FIFO-register which outputs the recovered data bit stream via an output terminal 3 of the data recovery unit 1. The number of data recognition FIR-Filters corresponds to the decimation factor (DF) of the serial-to-parallel-conversion unit 12. The data samples of the parallised data bit stream around the adjusted sampling time are weighted by the data recognition FIR-Filters by means of amplifiers having programmable gains $a_i$. The programmable gains $a_i$ are applied to the data recognition FIR-Filters by a control unit within the data recognition means 13d.

Figure 14:
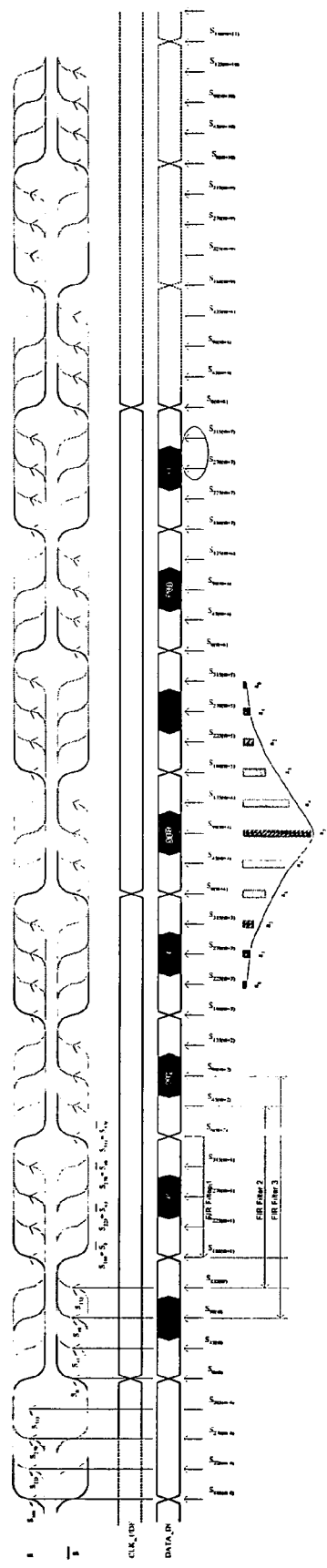
FIG. 14 shows a timing diagram to illustrate the functionality of the data recognition unit according to the present invention.

The gain $a_5$ of the data sample closest to the ideal sampling point within the center of a signal eye is set by the control unit within the data recognition unit 13d to have the highest value as can be seen in FIG. 14. The band of the weighted data samples spread over several signal eyes as can be seen in FIG. 14. Each signal eye is evaluated separately based on the impulse response of the data recognition FIR-Filter.

Each data recognition FIR filter evaluates also data samples of least one preceding signal data eye and of at least one following signal data eye. So that the data recognition by the FIR-filter is robust against additional noise and metastability of sampling elements in the oversampling unit 10 and in the serial-to parallel conversion unit 12.

Figure 15:
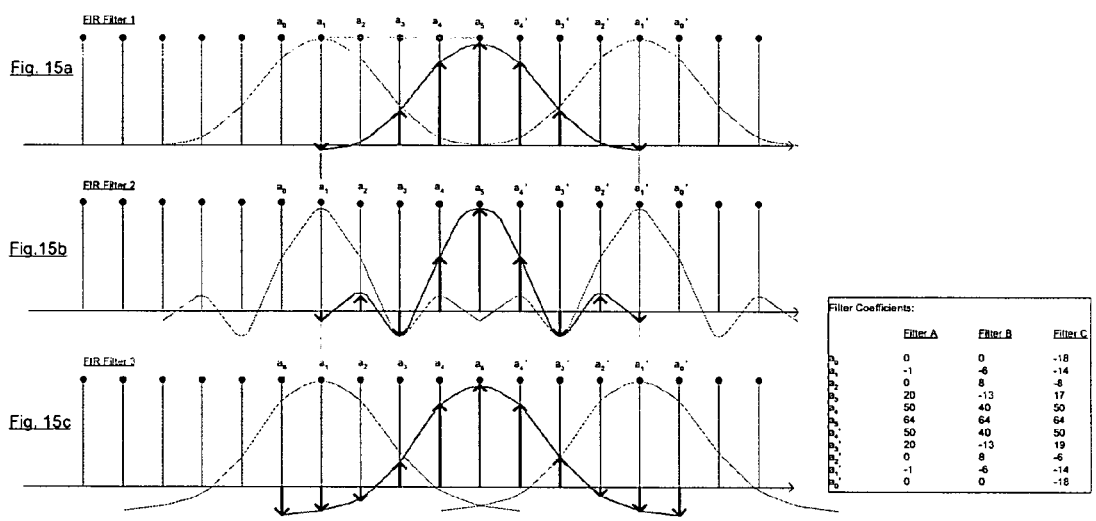
FIG. 15 shows a impulse response of FIR-Filters as employed in the data recognition unit according to the present invention.

FIG. 15 shows the impulse response for three different kinds of data recognition FIR-Filters as employed in the data recognition unit 13d according to the present invention. The filter coefficients for preferred embodiments of the FIR-Filters A, B, C are shown in FIG. 15.

Figure 16:
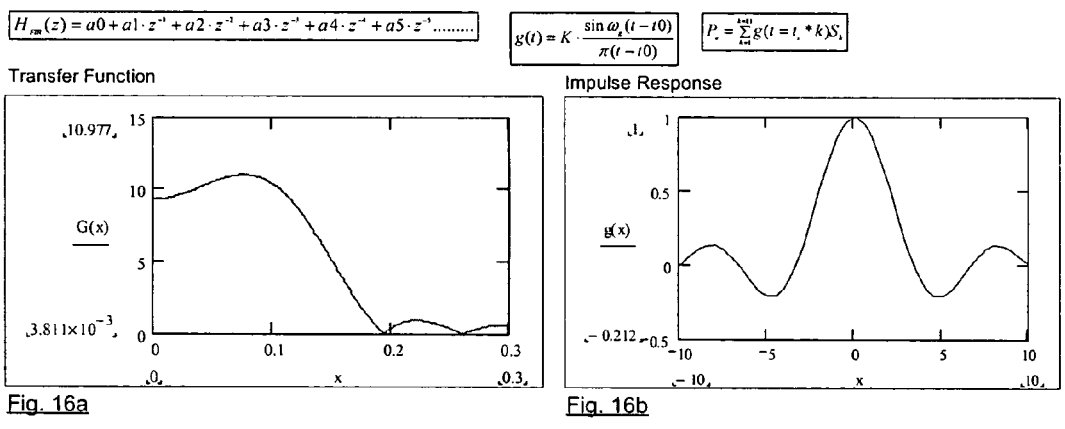
FIG. 16a shows a transfer function of a data recognition FIR-Filter according to the present invention.
FIG. 16b shows a corresponding impulse response of a data recognition FIR-Filter according to the present invention.

FIG. 16a shows the transfer function of a data recognition FIR-Filter according to a preferred embodiment.

FIG. 16b shows the corresponding impulse response of a preferred embodiment of a data recognition FIR-Filter as employed in the data recognition 13d according to the present invention.

Figure 17:
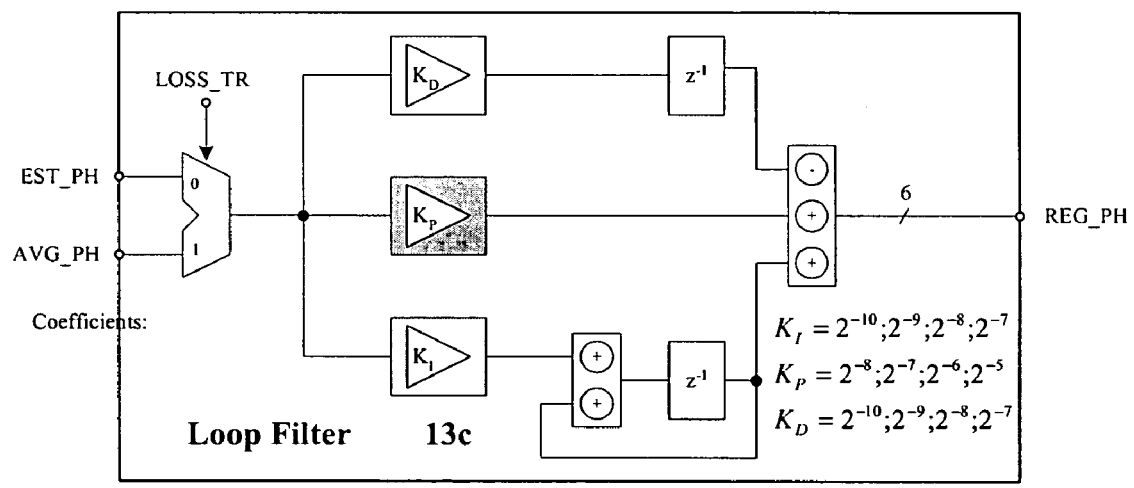
FIG. 17 shows a preferred embodiment of the loop filter according to the present invention.

FIG. 17 shows a preferred embodiment of the loop filter 13c within the digital control unit 13. FIG. 17 shows the loop filter 13c within the digital control unit 13. The loop filter 13c is provided for filtering the detected average phase difference output by the binary phase detection unit 13b to generate the rotation control signal for the phase interpolation unit 9. The loop filter 13c comprises in a preferred embodiment a PID filter characteristic. The PID-loop filter as shown in FIG. 17 comprises a proportional signal path, an derivative signal path and an integrating signal path. The three different signal paths are summed up by summing means and output to the phase interpolation unit 9.

Figure 18:
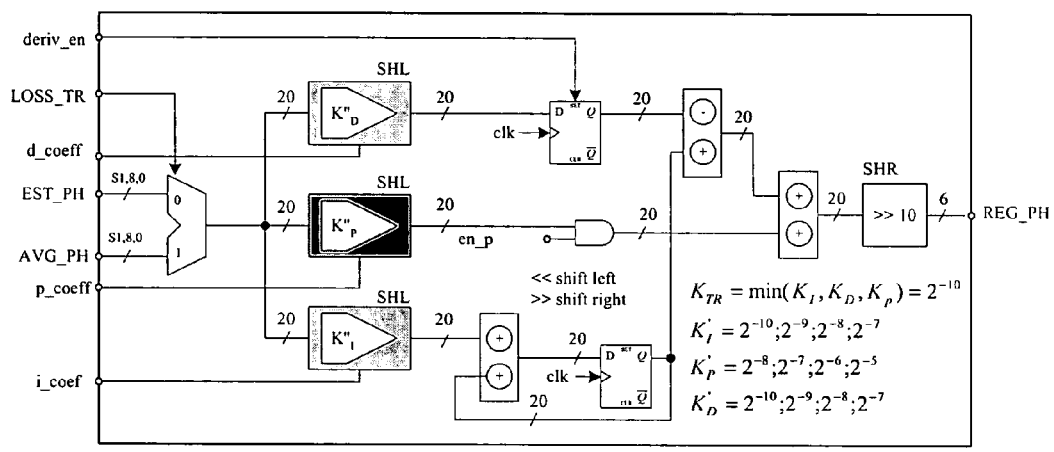
FIG. 18 shows a preferred embodiment of a programmable loop filter according to the present invention.

FIG. 18 shows an implementation of a loop filter 13c wherein the signal gain of the different signal paths are programmable by applying coefficients (COEF-D, COEF-P, COEF-I).

In a preferred embodiment the loop filter 13c, the binary phase detector 13b and the data recognition unit 13d are all integrated into a digital control unit 13 as can be seen in FIG. 7. In a preferred embodiment the digital control unit 13 further includes a register 13a to receive the parallised data stream from the serial-to-parallel-conversion unit 12, the loss of transition detection unit 13e and the lock detection unit 13f. The digital control unit 13 comprises an internal data bus 15 so that the parallised data stream which is memorized in register 13a can be applied to the binary phase detection unit 13b and to the data recognition unit 13d simultaneously. The loop filter 13c receives the detected average phase difference signal (AV–PH) from the binary phase detector 13b via an internal line 16 and outputs the filtered signal via a control line 14 to the phase interpolation unit 9 as can be seen in FIG. 7.

Figure 19:
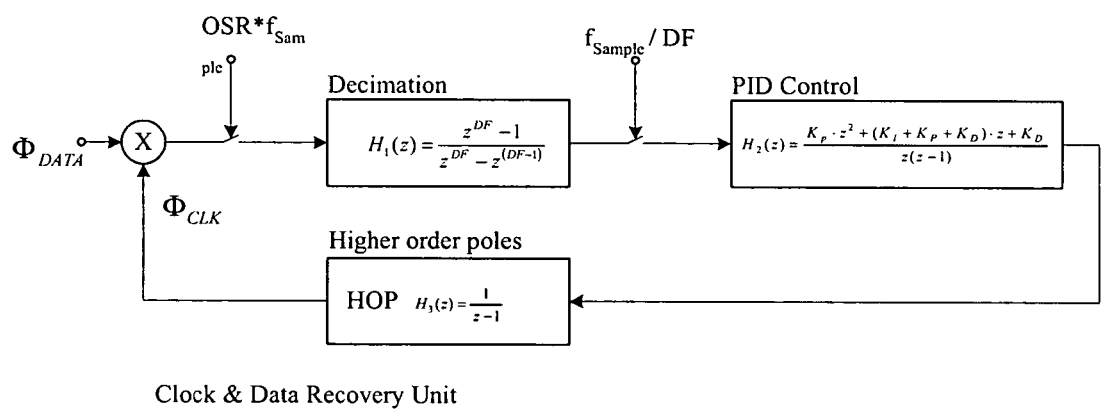
FIG. 19 shows a liniarized model of the clock and data recovery unit according to the present invention.

FIG. 19 shows a liniarized transfer function model of the clock and data recovery unit 1 according to the present invention in the Z-domain.

The received serial data bit stream is oversampled by the oversampling unit 10 with the sampling frequency $f_{sam}$ and an oversampling ratio OSR.

By the serial-to-parallel-conversion unit 12 the data stream is decimated with a transfer function:

$$H_1(z) = \frac{z^{DF} - 1}{z^{DF} - z^{(DF-1)}}$$

The loop filter 13c is clocked with a decimated clock signal.

As can be seen in FIG. 10 all units in the digital control unit 13 receive an internal decimated clock signal via an internal clock line 17.

The loop filter 13c comprises a PID-control transfer function:

$$H_2(z) = \frac{K_p \cdot z^2 + (K_i + K_p + K_d) \cdot z + K_d}{z(z-1)}$$

Higher order poles are introduced by an open loop transfer function of the loop filter:

$$H_3(z) = \frac{1}{z-1}$$

Figure 20:
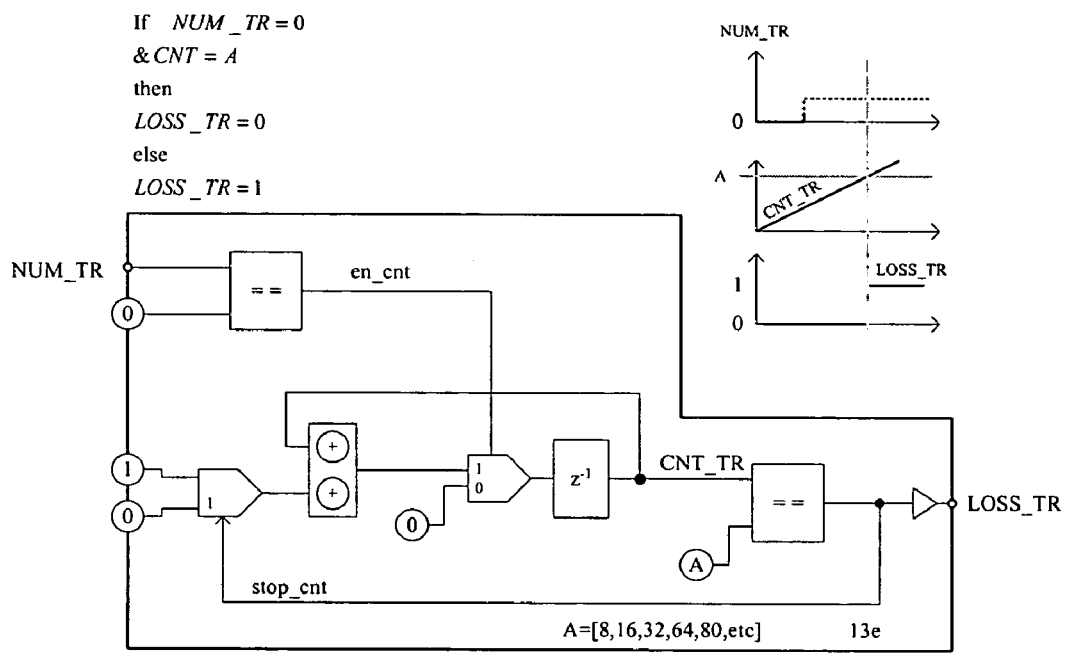
FIG. 20 shows a block diagram of a preferred embodiment of the transition loss detection unit according to the present invention.

FIG. 20 shows a preferred embodiment of the transition loss detection unit 13e within the digital control unit 13. The transition loss detection unit 13e detects when no serial data are received by the clock and data recovery unit 1. If no data transition occur a comparison unit causes that a counter CNT–TR is incremented. If the incremented count value CNT–TR exceeds a programmable threshold value A a loss of transition is indicated by the transition loss detection unit 13e via the output terminal 6 of the digital control unit 13.

If NUM–TR=0 and CNT–TR=A than LOSS–TR=0 else LOSS–TR=1.

Figure 21:
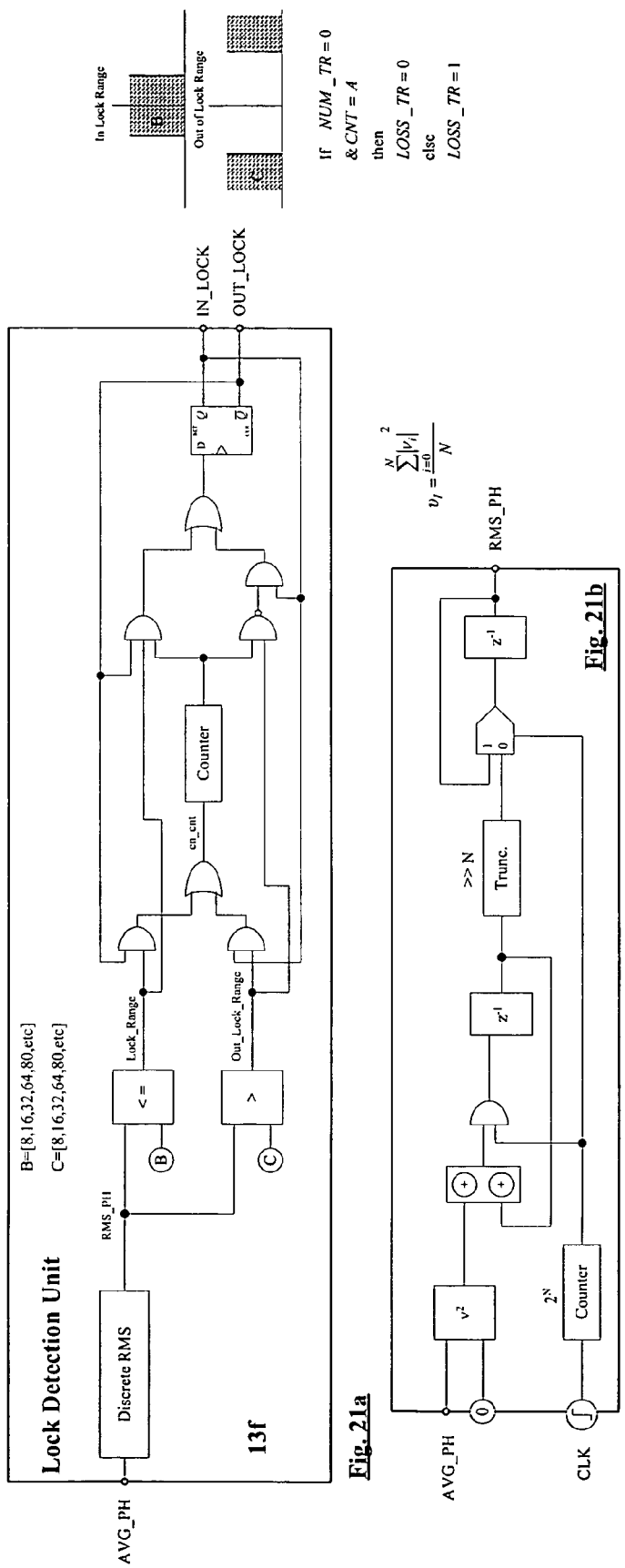
FIG. 21 shows a preferred embodiment of a lock detection unit according to the present invention.

FIG. 21a shows a preferred embodiment of the lock detection unit 13f within the digital control unit 13.

The lock detection unit 13f receives the detected average phase signal from the binary phase detector 13b. The received average phase signal is applied to a RMS-unit (RMS=route mean square) shown in FIG. 21b which generates a route mean square phase signal applied to two comparators comparing the route mean square phase signal to programmable threshold values B, C. If the route mean square phase signal is smaller than the first threshold value B it is detected that the signal is within a lock range and if the RMS–PH signal is higher than the second threshold value C the signal is within a outlock range. The counter counts how long the signal is within the lock range or in the outlock range. When the received signal is for a predetermined time within the lock range a CDR-lock indicating signal is set to high. If the received signal is for a longer time within the outlock range a CDR-loss signal is set to high by the lock detection unit 13f.

Figure 22:
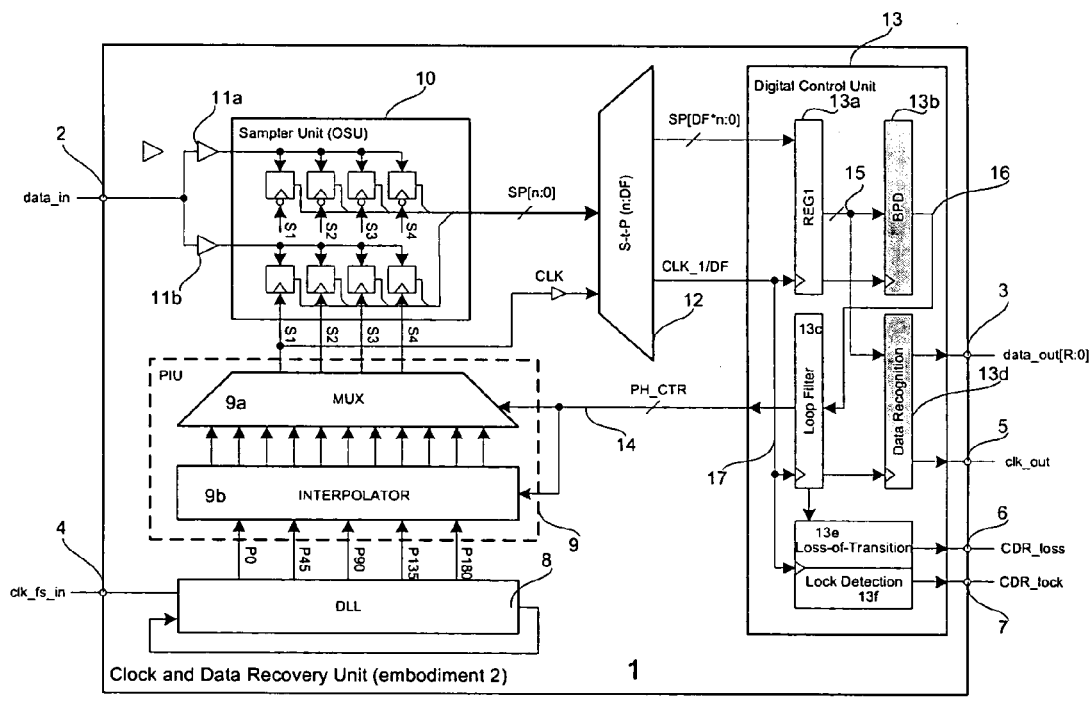
FIG. 22 shows a second embodiment of the clock and data recovery unit according to the present invention.

FIG. 22, shows a second embodiment of the clock and data recovery unit 1 according to the present invention. In this embodiment the phase interpolation unit 9 comprises a multiplexer 9a and an interpolation unit 9b. The interpolation unit 9b interpolates the received reference phase signal $P_i$ and applies the rotated phase signals Si to the input of the multiplexer 9a. The multiplexer 9a selects according to the control signal a rotated and interpolated phase signals S0, S45, S90, S135 to be applied to the oversampling unit 10. The advantage of the phase interpolation unit 9 as shown in FIG. 22 is that the technical complexity of the oversampling unit 10 can be reduced in comparison to the first embodiment as shown in FIG. 7.

Figure 23:
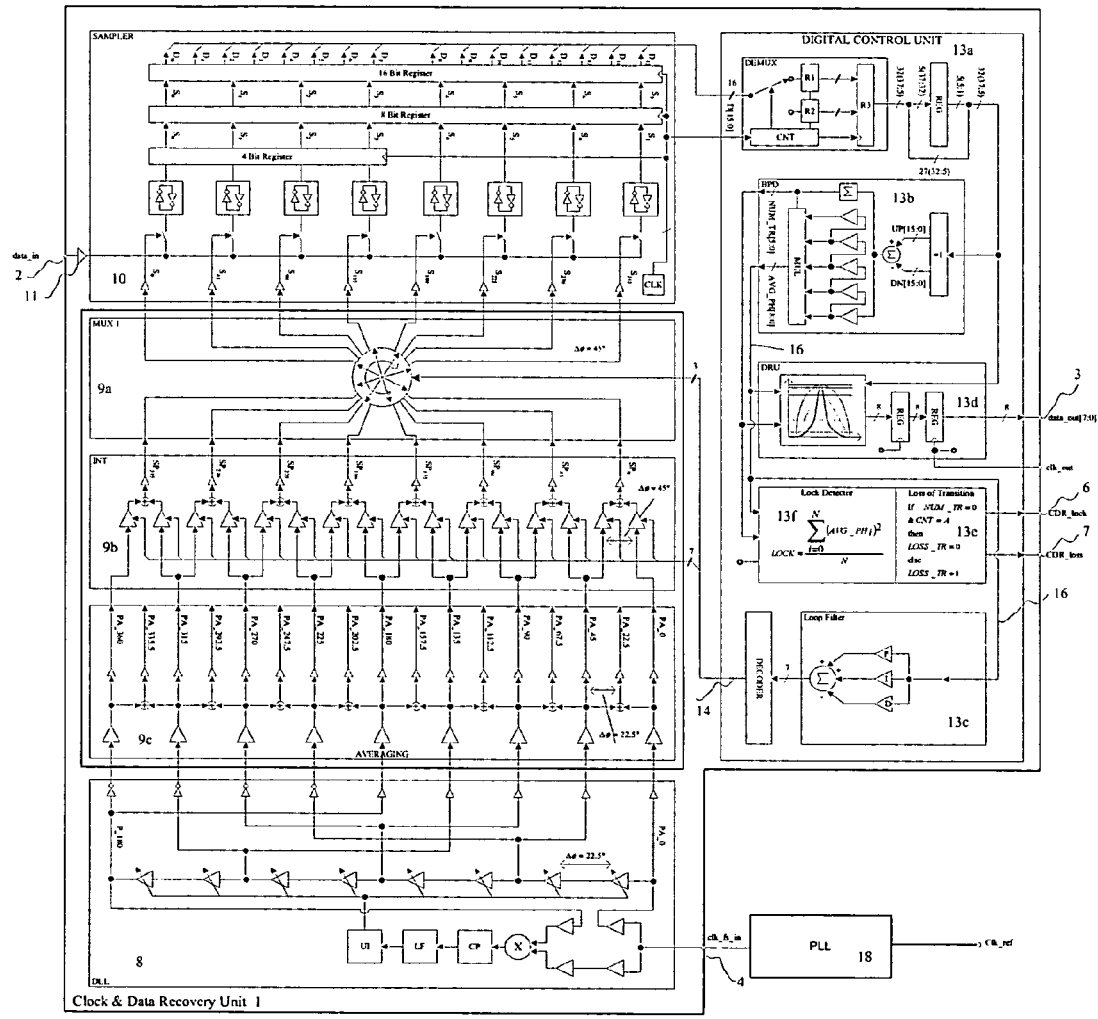
FIG. 23 shows a detailed circuit diagram of the second embodiment of the clock and data recovery unit according to the present invention.

FIG. 23 shows in detail an implementation of the clock and data recovery unit 1 as shown in FIG. 22.

The clock and data recovery unit 1 as shown in FIG. 23 is connected to a phase locked loop which provides the clock and data recovery unit 1 with a reference clock signal. The reference phase signal $P_i$ generated by the delay locked loop 8 is applied to an average unit and to an interpolation stage. The multiplexer 9a controlled by the loop filter 13c via control lines 14 performs the phase rotation. The interpolated and rotated phase signals are applied to the oversampling unit 10.

Figure 24:
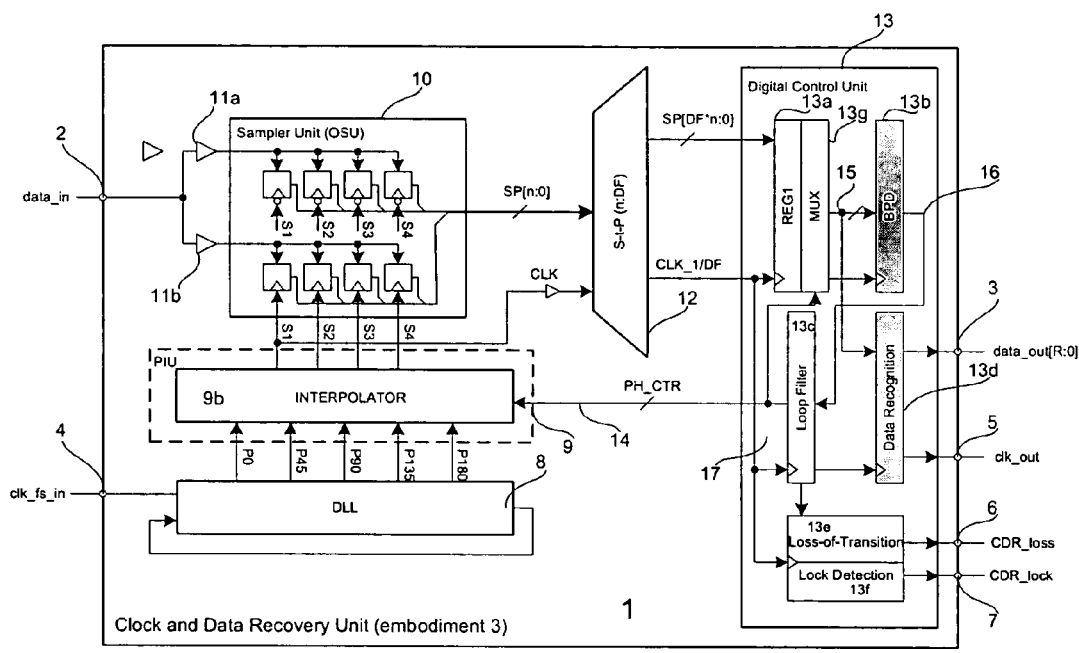
FIG. 24 shows a third embodiment of the clock and data recovery unit according to the present invention.

FIG. 24 shows a third embodiment of the clock and data recovery unit 1 according to the present invention wherein the rotation of the phase signal is performed within the digital control unit 13.

As can be seen from FIG. 24 the digital control unit 13 comprises an integrated controlled rotator 13g. The integrated rotator 13g receives a control signal from the loop filter 13c via the control line 14.

Figure 25:
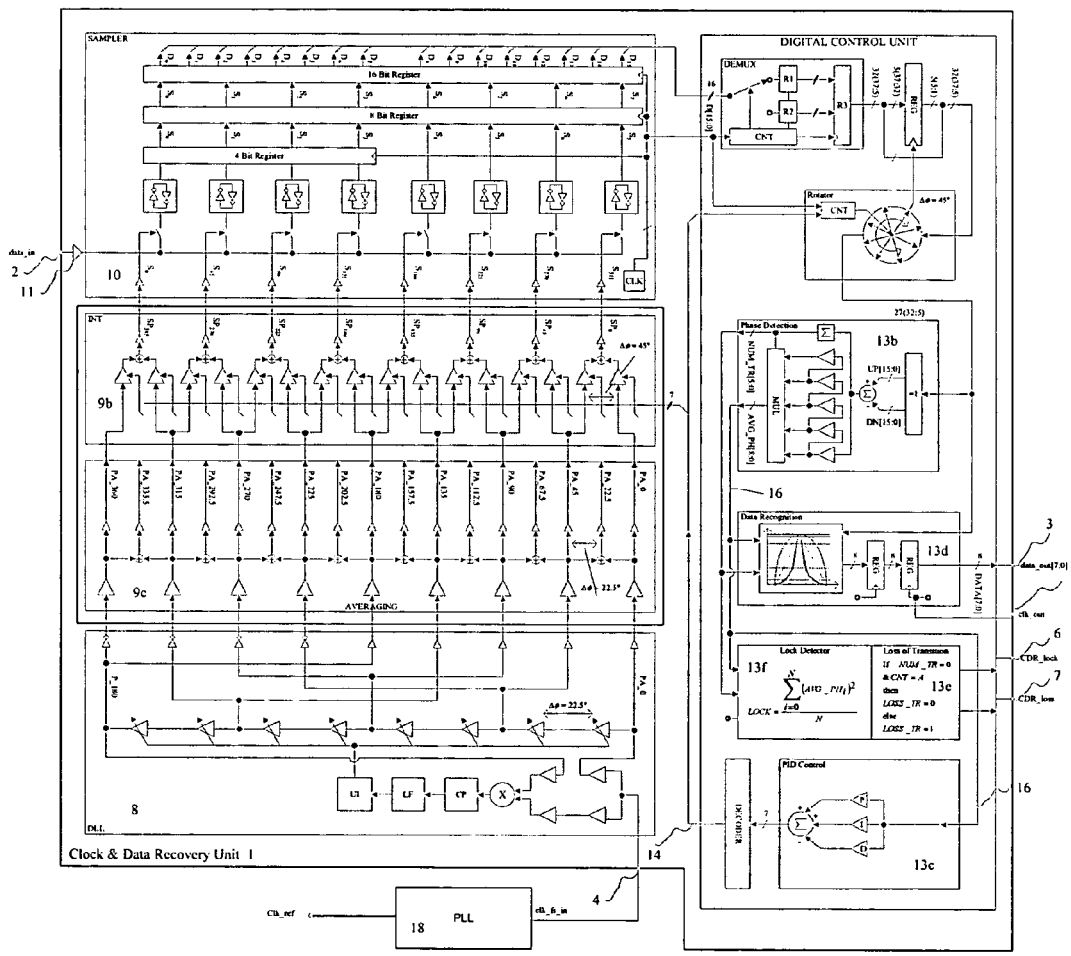
FIG. 25 shows a detailed circuit diagram of the third embodiment of the clock and data recovery unit according to the present invention.

FIG. 25 shows a detailed circuit diagram of the third embodiment of the clock and data recovery unit 1.

The clock and data recovery unit 1 according to the present invention uses data samples for the phase estimation as well as for the data recognition. The deserialized data stream output by the serial-and-parallel-conversion unit 12 and stored in the internal register 13a of the digital control unit 13 is applied to the binary phase detector 13b and at the same time to the data recognition unit 13d.

Redundant information due to the oversampling is used to improve the data recognition.

Because of the gain adjustment performed within the binary phase detector 13b the clock and data recovery unit 1 according to the present invention is insensitive to variations in the data density DD of the received serial bit data stream.

The phase control is carried out by means of an algorithm.

The advantage is the averaging of the phase error in the phase detector PD, while at the same time guaranteeing a mean phase detector gain. This is particularly necessary for low data densities, and is advantageous in comparison to conventional phase picking methods.

The data recovery according to the invention is carried out using an asymmetric form filter so that the preceding samples are assessed to a greater extent. In contrast to the conventional data recovery methods, the data is recovered according to the present invention at a lower data rate DR, using redundant information. This implementation is considerably more robust, since the clock and data recovery unit 1 according to the invention uses more signal energy for the assessment than conventional clock and data recovery units. The control loop of the clock and data recovery unit 1 according to the present invention contains a programmable loop filter with a PID characteristic.

The invention provides a combination of discrete-time and continuos-time methods for data recovery based on phase interpolation. An algorithm is used for evaluation of the sampled data signals. According to the present invention the signal evaluation and processing data is carried out completely digital.

What is claimed is:

1. A clock and data recovery unit for recovering a received serial data bit stream having:
   (a) phase adjustment means for adjustment of a sampling time in the center of a unit interval of the received data bit stream, wherein the phase adjustment means comprises:
      (a1) means for generating equidistant reference phase signals;
      (a2) a phase interpolation unit which rotates the generated reference phase signals with a predetermined granularity in response to a rotation control signal;
      (a3) an oversampling unit for oversampling the received data bit stream with the rotated reference phase signals according to a predetermined oversampling rate;
      (a4) a serial-to-parallel-conversion unit which converts the oversampled data bit stream into a deserialized data bit stream with a predetermined decimation factor;
      (a5) a binary phase detection unit for detecting an average phase difference between the received serial data bit stream and the rotated reference phase signal by adjusting a phase detector gain depending on an actual data density of the deserialized data bit stream such that the variation of the average phase detection gain is minimized; and
      (a6) a loop filter for filtering the detected average phase difference to generate the rotation control signal for the phase interpolation unit;
   (b) data recognition means for recovery of the received data bit stream which includes a number of parallel data recognition FIR-Filters, wherein each data recognition FIR-Filter comprises:
      (b1) a weighting unit for weighting data samples of the deserialized data bit stream around the sampling time adjusted by the phase adjustment means;
      (b2) a summing unit for summing up the weighted data samples; and
      (b3) a comparator unit for comparing the summed up data samples with a threshold value to detect the logic value of a data bit within the received serial data bit stream.

2. The clock and data recovery unit according to claim 1 wherein the binary phase detection unit comprises:
   means for detecting the actual data density of the deserialized data bit stream; and
   means for adjusting the phase detector gain depending on the detected actual data density.

3. The clock and data recovery unit according to claim 2 wherein the means for detecting the actual data density comprises a plurality of EXOR gates,
wherein each EXOR gate compares two neighboring data samples generated by the oversampling unit to decide whether a data transition has occurred.

4. The clock and data recovery unit according to claim 3 wherein the means for detecting the actual data density further comprises summation means for accumulating the number of transitions detected by the EXOR gates.

5. The clock and data recovery unit according to claim 4 wherein the means for adjusting the phase detector gain calculates the phase detector gain by multiplying the accumulated number of transitions with a multiplication factor.

6. The clock and data recovery unit according to claim 5 wherein the multiplication factor is increased when the detected number of transitions is decreased.

7. The clock and data recovery unit according to claim 3 wherein the number of EXOR gates for detection of the actual data density is given by the product of the decimation factor of the serial-to-parallel-conversion unit and the oversampling rate of the oversampling unit.

8. The clock and data recovery unit according to claim 1 wherein the decimation factor of the serial to parallel conversion unit is eight.

9. The clock and data recovery unit according to claim 1 wherein the oversampling rate of the oversampling unit is four.

10. The clock and data recovery unit according to claim 1 wherein a data transmission rate of the serial data bit stream is more than one Gigabit per second.

11. The clock and data recovery unit according to claim 1 wherein the weighting unit of the data recognition means comprises signal amplifiers, wherein each signal amplifier amplifies a respective data sample with a programmable gain.

12. The clock and data recovery unit according to claim 1 wherein the data recognition FIR-Filters of the data recognition means are connected to a FIFO-memory.

13. The clock and data recovery unit according to claim 1 wherein the number of data recognition FIR-Filters corresponds to the decimation factor of the serial-to-parallel-conversion unit.

14. The clock and data recovery unit according to claim 1 wherein the oversampling unit comprises a predetermined number of clock triggered sampling elements.

15. The clock and data recovery unit according to claim 14 wherein the sampling elements are D-Flip-Flops.

16. The clock and data recovery unit according to claim 14 wherein the sampling elements are D-Latches.

17. The clock and data recovery unit according to claim 14 wherein each sampling element is clocked by a corresponding rotated reference phase signal generated by the phase interpolation unit.

18. The clock and data recovery unit according to claim 17, wherein the phase interpolation unit comprises a phase interpolator and a multiplexer for rotating the reference phase signals in response to the rotation control signal.

19. The clock and data recovery unit according to claim 1 wherein a delay locked loop receives a reference clock signal from a reference clock generator.

20. The clock and data recovery unit according to claim 19 wherein the reference clock generator is a phase locked loop.

21. The clock and data recovery unit according to claim 1 wherein the loop filter has a PID-characteristic.

22. The clock and data recovery unit according to claim 1 wherein the loop filter is programmable.

23. The clock and data recovery unit according to claim 1 wherein a lock detection unit is provided which detects whether the clock and data recovery unit is locked to the received serial data bit stream.

24. The clock and data recovery unit according to claim 1 wherein a transition loss detection unit is provided which detects when the serial data bit stream has stopped.

25. The clock and data recovery unit according to claim 24 wherein a multiplexer for rotating the reference phase signal in response to the rotation control signal is integrated in a digital control unit.

26. The clock and data recovery unit according to claim 1 wherein the phase adjustment means and the data recognition means are integrated in a digital control unit.

27. The clock and data recovery unit according to claim 26 wherein the digital control unit further includes a lock detection unit and a transition loss detection unit.

28. The clock and data recovery unit according to claim 1 wherein the equidistant reference phase signals generated by a delay locked loop have a phase difference $\Delta\phi$ of 45° to define eight phase segments.

29. The clock and data recovery unit according to claim 28 wherein the phase interpolator interpolates phase signals in each phase segment on the basis of the equidistant reference phase signals.

30. The clock and data recovery unit according to claim 1 wherein the means for generating equidistant reference phase signals are formed by a delay locked loop.

31. Method for clock and data recovery of a received serial data bit stream comprising the following steps:
(a) adjusting a sampling time in the center of a unit interval of a received data bit comprising the following substeps:
 (a1) generating reference phase signals;
 (a2) rotating said reference phase signals in response to a rotation control signal;
 (a3) oversampling the received data bit stream with the rotated reference phase signals;
 (a4) converting an oversampled data bit stream into a deserialized data stream;
 (a5) detecting an average phase difference between the received serial data bit stream and the rotated phase signals by adjusting a phase detector gain depending on a data density of the deserialized data stream to minimize the variation of an average phase detector gain;
 (a6) filtering the detected phase difference to generate the rotation control signal;
(b) recovering the received data bit stream comprising the following substeps:
 (b1) weighting data samples of the deserialized data stream around the adjusted sampling time;
 (b2) summing up the weighted data samples;
 (b3) comparing the summed up weighted data samples with a threshold value to detect the logic value of a data bit within the serial data bit stream.

* * * * *